United States Patent [19]
Passlack et al.

[11] Patent Number: 6,025,281
[45] Date of Patent: Feb. 15, 2000

[54] PASSIVATION OF OXIDE-COMPOUND SEMICONDUCTOR INTERFACES

[75] Inventors: Matthias Passlack, Chandler; Jonathan K. Abrokwah, Tempe; Sandeep Pendharkar, Gilbert; Stephen B. Clemens, Mesa; Jimmy Z. Yu, Gilbert; Brian Bowers, Mesa, all of Ariz.

[73] Assignee: Motorola, Inc., Schaumburg, Ill.

[21] Appl. No.: 08/993,603

[22] Filed: Dec. 18, 1997

[51] Int. Cl.[7] .................................................. H01L 21/316
[52] U.S. Cl. .............................. 438/779; 438/796; 438/38
[58] Field of Search ....................................... 438/475, 513, 438/520, 483, 910, 308, 378, 906, 798, 796, 948, 949, 953, 779, 38

[56] References Cited

U.S. PATENT DOCUMENTS

| | | | |
|---|---|---|---|
| 4,062,747 | 12/1977 | Chang ........................................ | 204/164 |
| 4,297,176 | 10/1981 | Hannah et al. ........................... | 638/606 |
| 4,364,779 | 12/1982 | Kamgar et al. .......................... | 438/301 |
| 4,426,656 | 1/1984 | DiLorenzo et al. ...................... | 257/284 |
| 5,051,786 | 9/1991 | Nicollian et al. ......................... | 257/22 |
| 5,059,551 | 10/1991 | Caevallier et al. ....................... | 435/796 |
| 5,172,906 | 10/1979 | Pancholy .................................. | 427/82 |
| 5,179,029 | 1/1993 | Gottscho et al. ......................... | 438/796 |
| 5,451,548 | 9/1995 | Hunt et al. ................................ | 438/38 |
| 5,464,664 | 11/1995 | Aydil et al. .............................. | 427/535 |
| 5,518,932 | 5/1996 | Cunningham et al. ................... | 438/798 |
| 5,550,084 | 8/1996 | Dutta et al. ............................... | 438/29 |
| 5,595,917 | 1/1997 | DeLaney et al. ......................... | 938/796 |
| 5,597,768 | 1/1997 | Passlack et al. .......................... | 438/38 |
| 5,821,171 | 10/1998 | Hong et al. ............................... | 438/767 |
| 5,902,130 | 5/1999 | Passlack et al. .......................... | 438/604 |
| 5,904,553 | 5/1999 | Passlack et al. .......................... | 438/590 |

*Primary Examiner*—Savitri Mulpuri
*Attorney, Agent, or Firm*—Rennie W. Dover

[57] ABSTRACT

A method of passivating interface states of oxide-compound semiconductor interfaces using molecular, atomic, or isotopic species wherein said species are applied before oxide deposition in ultra-high vacuum, or during interruption of oxide deposition in ultra-high vacuum (preferentially after oxide surface coverage of a submonolayer, a monolayer, or a few monolayers), or during oxide deposition in ultra-high vacuum, or after completion of oxide deposition, or before or after any processing steps of the as deposited interface structure. In a preferred embodiment, hydrogen or deuterium atoms are applied to a $Ga_2O_3$—GaAs interface at some point before, during, or after oxide deposition in ultra-high vacuum, or before or after any processing steps of the as deposited interface structure, at any given and useful substrate temperature wherein the atomic species can be provided by any one of RF discharge, microwave plasma discharge, or thermal dissociation.

10 Claims, 2 Drawing Sheets

PASSIVATION OF OXIDE-COMPOUND SEMICONDUCTOR INTERFACES

FIELD OF THE INVENTION

The invention pertains to a method of passivating interface states at oxide-compound semiconductor interfaces and more specifically to a method of passivating interface states at $Ga_2O_3$—GaAs interfaces.

BACKGROUND OF THE INVENTION

Oxide-semiconductor interfaces are the workhorse of the semiconductor industry. The requirements for gate quality oxide-semiconductor structures are manifold; among the requirements for functional accumulation/inversion mode devices is a low interface state density $D_{it} < 10^{11}$ cm$^{-2}$ eV$^{-1}$. In silicon technology, interface states of as processed $SiO_2$—Si interfaces ($N_{it} \cong 10^{12}$ cm$^{-2}$) are ascribed to silicon dangling bonds such as $P_b$ centers. It is well known in the art, that the interface state density of an as processed structure can be drastically reduced to as low as $10^8$ cm$^{-2}$ by annealing in a hydrogen ($H_2$) or more recently, in a deuterium ($D_2$) containing atmosphere.

For compound semiconductors, functional oxide-III–V compound semiconductor interfaces are fabricated by in situ deposition of gallium oxide molecules on GaAs based epitaxial layers while maintaining an ultra-high vacuum (UHV), see for instance U.S. Pat. No. 5,451,548 entitled "Electron beam deposition of gallium oxide thin films using a single purity crystal source", issued Sep. 19, 1995, M. Hunt et al., Appl. Phys. Lett., vol. 68, 1099 (1996), Appl. Phys. Lett., vol. 68, 3605 (1996), and Appl. Phys. Lett., vol. 69, 302 (1996). For as deposited structures, an interface state density $N_{it} \cong 1$–$2 \times 10^{11}$ cm$^{-2}$ was achieved with a minimum of $D_{it} \cong 3$–$4 \times 10^{10}$ cm$^{-2}$ eV$^{-1}$ around midgap. More recent measurements indicated a $D_{it}$ in the upper $10^{11}$ cm$^{-2}$ eV$^{-1}$ range close to the band edges. Device performance is affected since the energy range in the vicinity of the band edges is of crucial importance for accumulation/inversion type devices.

For GaAs, it has been speculated that passivation effects, for example due to $H_2$, could reduce the surface state density to acceptable levels as well, see for instance F. Capasso et al., J. Electrochem. Soc., vol. 129, 821 (1982). However, experimental proof for the hypothesis could not be provided and the role of hydrogen has been diminished to cleaning of GaAs surfaces only, see for instance U.S. Pat. No. 4,859,253 entitled "Method for passivating a compound semiconductor surface and device having improved semiconductor-insulator interface", issued Aug. 22, 1989.

Accordingly, it would be highly desirable to provide new methods of passivation of interface states which overcome these problems.

It is a purpose of the present invention to provide a new and improved method for passivating interface states at oxide-compound semiconductor interfaces.

It is another purpose of the present invention to provide a new and improved method for passivating interface states at oxide-GaAs interfaces.

It is still another purpose of the present invention to provide a new and improved method for passivating interface states at $Ga_2O_3$—GaAs interfaces.

It is yet another purpose of the present invention to provide a new and improved method for passivating interface states at oxide-compound semiconductor interfaces using molecular, atomic, or isotopic species.

It is a further purpose of the present invention to provide a new and improved method for passivating interface states at oxide-compound semiconductor interfaces wherein said molecular, atomic, or isotopic species are applied before oxide deposition in ultra-high vacuum.

It is still a further purpose of the present invention to provide a new and improved method for passivating interface states at oxide-compound semiconductor interfaces wherein said molecular, atomic, or isotopic species are applied during interruption of oxide deposition in ultra-high vacuum (preferentially after oxide surface coverage of a submonolayer, a monolayer, or a few monolayers).

It is yet a further purpose of the present invention to provide a new and improved method for passivating interface states at oxide-compound semiconductor interfaces wherein said molecular, atomic, or isotopic species are applied during oxide deposition in ultra-high vacuum.

It is still a further purpose of the present invention to provide a new and improved method for passivating interface states at oxide-compound semiconductor interfaces wherein said molecular, atomic, or isotopic species are applied after completion of oxide deposition.

It is yet a further purpose of the present invention to provide a new and improved method for passivating interface states at oxide-compound semiconductor interfaces wherein said molecular, atomic, or isotopic species are applied before or after any processing steps of the as deposited interface structure.

It is still a further purpose of the present invention to provide a new and improved method for passivating interface states at oxide-compound semiconductor interfaces wherein said molecular, atomic, or isotopic species are molecular/atomic hydrogen or molecular/atomic deuterium.

It is yet a further purpose of the present invention to provide a new and improved method for passivating interface states at oxide-compound semiconductor interfaces wherein said molecular, atomic, or isotopic species are molecular or atomic nitrogen.

It is still a further purpose of the present invention to provide a new and improved method for passivating interface states at oxide-compound semiconductor interfaces such that the interface state density, in particular in the vicinity of the band edges, is significantly reduced.

It is yet a further purpose of the present invention to provide a new and improved method for passivating interface states at oxide-compound semiconductor interfaces such that the performance of accumulation/inversion type devices is not affected.

It is still a further purpose of the present invention to provide a new and improved method of manufacturing a gate quality oxide-compound semiconductor structure which is relatively easy to fabricate and use.

It is yet a further purpose of the present invention to provide a new and improved method of manufacturing a gate quality $Ga_2O_3$-compound semiconductor structure which is relatively easy to fabricate and use.

SUMMARY OF THE INVENTION

The above problems and others are at least partially solved and the above purposes and others are realized in a method of passivating interface states of oxide-compound semiconductor interfaces using molecular, atomic, or isotopic species wherein said species are applied before oxide deposition in ultra-high vacuum, or during interruption of oxide deposition in ultra-high vacuum (preferentially after oxide surface coverage of a submonolayer, a monolayer, or a few monolayers), or during oxide deposition in ultra-high vacuum, or after completion of oxide deposition, or before or after any processing steps of the as deposited interface structure.

In a preferred embodiment, hydrogen or deuterium atoms are applied to a $Ga_2O_3$—GaAs interface before oxide deposition in ultra-high vacuum, or during interruption of oxide deposition in ultra-high vacuum (preferentially after oxide surface coverage of a submonolayer, a monolayer, or a few monolayers), or during oxide deposition in ultra-high vacuum, or after completion of oxide deposition, or before or after any processing steps of the as deposited interface structure, at any given and useful substrate temperature wherein the atomic species can be provided by any one of RF discharge, microwave plasma discharge, or thermal dissociation.

BRIEF DESCRIPTION OF THE DRAWINGS

Referring to the drawings.

DESCRIPTION OF THE PREFERRED EMBODIMENT

Figure 1:
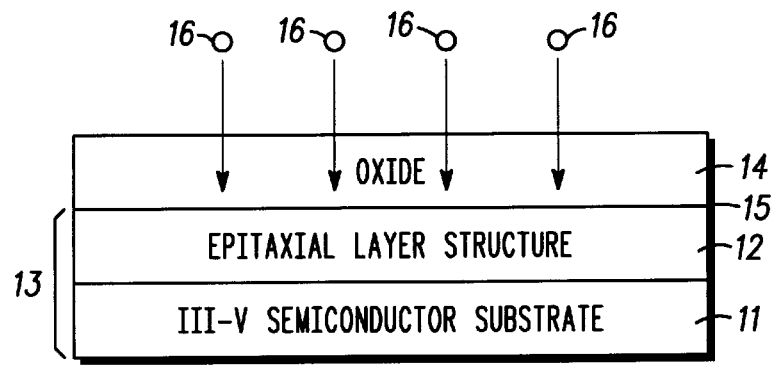
FIG. 1 is a simplified cross sectional view of a gate quality oxide-compound semiconductor structure in accordance with the present invention.

Referring specifically to FIG. 1, a simplified cross sectional view of a gate quality oxide-compound semiconductor structure 10 in accordance with the present invention is illustrated. Structure 10 includes a compound semiconductor material, such as any III–V material employed in any semiconductor device, represented herein by a III–V semiconductor substrate 11 and a compound semiconductor epitaxial layer structure 12. For purposes of this disclosure, the substrate and any epitaxial layers formed thereon will be referred to simply as a compound semiconductor wafer structure which in FIG. 1 is designated 13. Compound semiconductor wafer structure 13 has an upper surface 15 onto which an oxide layer 14 is positioned. It will of course be understood that in some specific applications (or on some portions of compound semiconductor wafer structure 13) there may be no epitaxial layers present and upper surface 15 may simply be the upper surface of substrate 11. For purposes of this disclosure, upper surface 15 may also be referred to as oxide-compound semiconductor interface 15.

In general, molecular, atomic or isotopic species 16 are applied to an oxide-compound semiconductor interface 15 (i) before oxide deposition in ultra-high vacuum, (ii) during interruption of oxide deposition in ultra-high vacuum (preferentially after oxide surface coverage of a submonolayer, a monolayer, or a few monolayers), (iii) during oxide deposition in ultra-high vacuum, (iv) after completion of oxide deposition, or (v) before or after any processing steps of the as deposited interface structure, at any given and useful substrate temperature. Atomic species can be provided by any one of RF discharge, microwave plasma discharge or thermal dissociation.

In a specific embodiment, atomic hydrogen is applied to as deposited $Ga_2O_3$—GaAs interface 15 in a Tegal 6000 etching tool with the substrate at room temperature. The atomic hydrogen is provided by an RF plasma discharge device (frequency=13.56 MHz). The following parameter range has been explored: RF power 5–500 W, pressure 2–75 mTorr, hydrogen flow 10 sccm, and time 5–300 s. The passivation effect has been found to depend only slightly on plasma parameters. Passivation effects due to molecular hydrogen (e.g. when using an RTA) could not be observed. It will of course be understood that hydrogen may be present or intentionally used in its isotopic form (deuterium).

Figure 2:
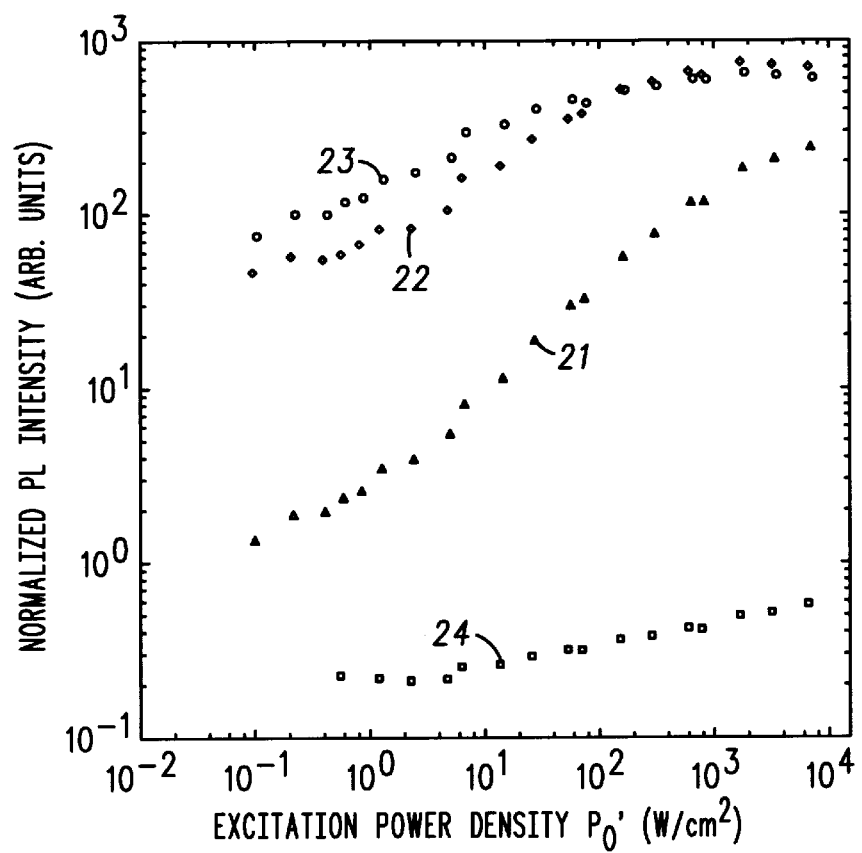
FIG. 2 is a graph illustrating the measured integrated GaAs photoluminescence intensity $I_{PL}$ normalized to the laser excitation density $P_0'$ entering the semiconductor wafer structure.

Turning now to FIG. 2, the measured integrated GaAs photoluminescence intensity $I_{PL}$ normalized to the laser excitation density $P_0'$ entering the semiconductor wafer structure is shown as a function of $P_0'$. Electronic interface properties such as interface recombination velocity S and interface state density $D_{it}$ have been inferred by a photoluminescence power spectroscopy technique. Results are shown for a $Ga_2O_3$—GaAs interface structure as deposited by a curve 21 and after hydrogen passivation by a curve 22, and for the purpose of comparison, of a AlGaAs—GaAs interface structure by a curve 23, and a bare GaAs surface by a curve 24. All wafers use identical GaAs epitaxial structures. FIG. 2 clearly illustrates the significant improvement obtained by applying atomic hydrogen to the as deposited $Ga_2O_3$—GaAs interface structure (curve 21); the obtained results (curve 22) approach the excellent interface quality of an AlGaAs—GaAs interface structure (curve 23).

Figure 3:
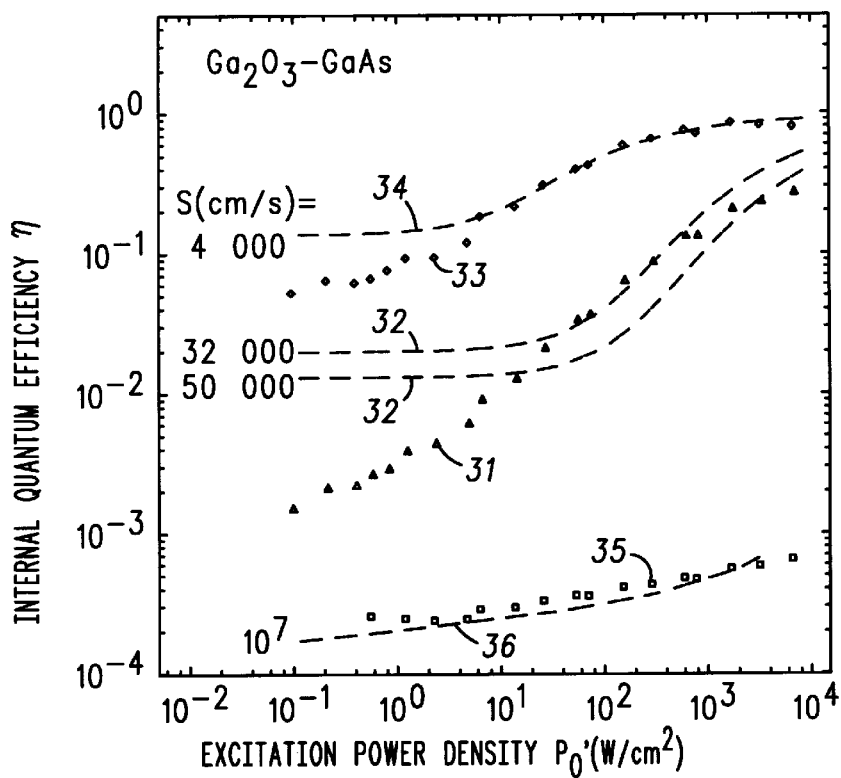
FIG. 3 is a graph illustrating the measured internal quantum efficiency $\eta$ and the low interface recombination velocity S of a $Ga_2O_3$—GaAs interface using atomic hydrogen passivation according to the invention.

Turning now to FIG. 3, the measured (symbols) and simulated (dashed lines) internal quantum efficiency $\eta$ is shown. A numerical simulator for semiconductor heterostructures has been used and the simulated results have been fitted to the measurements. Results are shown for a $Ga_2O_3$—GaAs interface structure 15 as deposited wherein curve 31 and curve 32 show the measured and simulated results, respectively, and after atomic hydrogen passivation wherein curve 33 and curve 34 show the measured and simulated results, respectively; and for the purpose of comparison, of a bare GaAs surface wherein curve 35 and curve 36 show the measured and simulated results, respectively. The poor fit for low excitation power density is due to the fact that band bending effects caused by charged interface states are not yet incorporated into the model.

Figure 4:
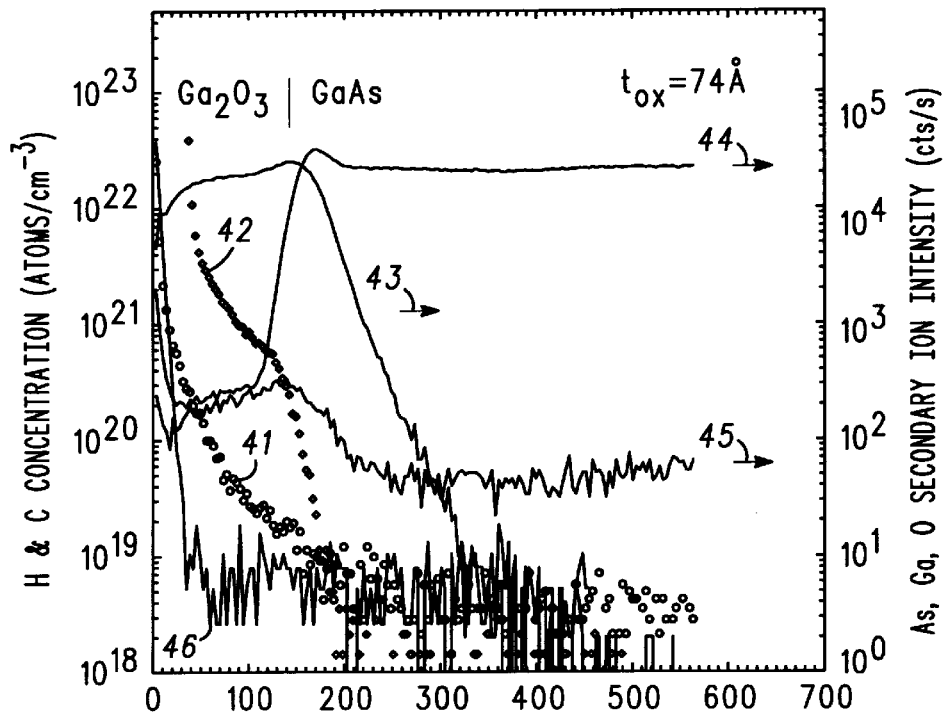
FIG. 4 is a graph illustrating the diffusion of hydrogen into the $Ga_2O_3$ film and the accumulation of hydrogen at $Ga_2O_3$—GaAs interface according to the present invention.

Turning now to FIG. 4, the SIMS (selective ion mass spectroscopy) depth profiles for H of the $Ga_2O_3$—GaAs interface structure 15 discussed in FIG. 1–FIG. 3 are illustrated wherein curve 41 shows the H depth profile of an as deposited $Ga_2O_3$—GaAs interface 15 and curve 42 shows the H depth profile of a $Ga_2O_3$—GaAs interface 15 after H passivation. A clear accumulation of hydrogen is detectable after atomic H was applied to $Ga_2O_3$—GaAs interface 15; the concentration of H increases from below $10^{19}$ cm$^{-3}$ (close to detection limit) of the as deposited $Ga_2O_3$—GaAs interface structure (curve 41) to above $10^{20}$ cm$^{-3}$ after atomic H was applied to the $Ga_2O_3$—GaAs interface structure (curve 42). FIG. 4 also shows the SIMS depth profiles of oxygen 43, As 44, Ga 45, and C 46. At the present time, both the nature of interface defects and the interaction of hydrogen with defects at $Ga_2O_3$—GaAs interfaces is not known. Table 1 summarizes the results of the interface characterization.

TABLE 1

| Structure | S (cm/s) | $N_{it}$ (cm$^{-2}$) | Interface H (cm$^{-3}$) |
|---|---|---|---|
| Ga$_2$O$_3$-GaAs, H passivated | 4000–5000 | $5 \times 10^9 - 2 \times 10^{10}$ | $>10^{20}$ |
| Ga$_2$O$_3$-GaAs, as deposited | 32000–50000 | $6 \times 10^{10} - 2 \times 10^{11}$ | $\leq 10^{19}$ |
| AlGaAS-GaAs | 1000–1500 | $(1-5) \times 10^9$ | n/a |
| Bare GaAs | $\approx 10^7$ | $\approx 2 \times 10^{13}$ | n/a |

Thus, a new and improved method to significantly reduce the defect density and interface state density which is observed at as deposited Ga$_2$O$_3$—GaAs interfaces is disclosed. Interface state densities as low as $10^{10}$ cm$^{-2}$ have been demonstrated. The low interface state density enables the fabrication of accumulation/inversion mode devices based on compound semiconductors with a performance unaffected by interface states.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of passivating interface states at oxide-compound semiconductor interfaces including the steps of:

providing a compound semiconductor wafer structure;

defining an oxide-compound semiconductor interface on the compound semiconductor wafer structure by depositing an interfacial oxide, wherein the interfacial oxide is Ga$_2$O$_3$; and after the step of defining an oxide-compound semiconductor interface on the compound semiconductor wafer structure by depositing an interfacial oxide, applying elements or their isotopes selected from the group consisting of hydrogen, deuterium, and nitrogen in their molecular or atomic form to the oxide-compound semiconductor interface during oxide deposition such that the interface state density at the oxide-compound semiconductor interface is reduced.

2. A method of passivating interface states at oxide-compound semiconductor interfaces as claimed in claim 1 wherein said elements or their isotopes are in their atomic form, selected from the group consisting of hydrogen, deuterium, and nitrogen, and are provided by any one of RF discharge, microwave plasma discharge, or thermal dissociation.

3. A method of passivating interface states at oxide-compound semiconductor interfaces as claimed in claim 1 wherein the step of providing a compound semiconductor wafer structure includes providing a compound semiconductor wafer of gallium arsenide (GaAs).

4. A method of passivating interface states at oxide-compound semiconductor interfaces as claimed in claim 1 wherein the step of providing a compound semiconductor wafer structure includes providing epitaxial compound semiconductor layers on the surface of a compound semiconductor wafer.

5. A method of passivating interface states at oxide-compound semiconductor interfaces as claimed in claim 1 wherein the step of providing a compound semiconductor wafer structure includes providing a compound semiconductor wafer with a semiconductor device formed thereon.

6. A method of passivating interface states at oxide-compound semiconductor interfaces including the steps of:

providing a compound semiconductor wafer structure;

defining an oxide-compound semiconductor interface on the compound semiconductor wafer structure by depositing an interfacial oxide, wherein the interfacial oxide is Ga$_2$O$_3$; and applying elements or their isotopes selected from the group consisting of hydrogen, deuterium, and nitrogen in their atomic or molecular form to the oxide-compound semiconductor interface during interruption of oxide deposition such that the interface state density at the oxide-compound semiconductor interface is reduced; and maintaining the structural integrity of the semiconductor, the oxide-compound semiconductor interface, and the oxide.

7. A method of passivating interface states at oxide-compound semiconductor interfaces as claimed in claim 6 wherein said elements or their isotopes selected from the group consisting of hydrogen, deuterium, and nitrogen are in their atomic form and are provided by any one of RF discharge, microwave plasma discharge, or thermal dissociation.

8. A method of passivating interface states at oxide-compound semiconductor interfaces as claimed in claim 6 wherein the step of providing a compound semiconductor wafer structure includes providing a compound semiconductor wafer of gallium arsenide (GaAs).

9. A method of passivating interface states at oxide-compound semiconductor interfaces as claimed in claim 6 wherein the step of providing a compound semiconductor wafer structure includes providing epitaxial compound semiconductor layers on the surface of a compound semiconductor wafer.

10. A method of passivating interface states at oxide-compound semiconductor interfaces as claimed in claim 6 wherein the step of providing a compound semiconductor wafer structure includes providing a compound semiconductor wafer with a semiconductor device formed thereon.

* * * * *